United States Patent [19]

Cox et al.

[11] 4,048,535
[45] Sept. 13, 1977

[54] LEAD-TIN-TELLURIDE PHOTODETECTOR ARRAY

[75] Inventors: John T. Cox, Alexandria; Michael B. Garber, Woodbridge; Marilyn A. Jasper, Springfield; Paul LoVecchio, Reston, all of Va.

[73] Assignee: The United States of America as represented by the Secretary of the Army, Washington, D.C.

[21] Appl. No.: 683,441

[22] Filed: May 4, 1976

[51] Int. Cl.² .................. H01J 31/38; H01J 29/45
[52] U.S. Cl. ................................. 313/367; 357/61; 357/30; 357/68; 357/71
[58] Field of Search .............. 313/367, 388, 101

[56] References Cited

U.S. PATENT DOCUMENTS 3,980,915  9/1976  Chapman et al. .............. 313/101

OTHER PUBLICATIONS

DeVaux et al., "THERMAL LIMITATIONS IN PbSnTe DETECTORS;" Infrared Physics, 1975, vol. 15, p. 271; Pergamon Press, printed in Great Britain.

Primary Examiner—Robert Segal
Attorney, Agent, or Firm—Nathan Edelberg; John E. Holford; Robert P. Gibson

[57] ABSTRACT

A method is provided for manufacturing lead-tin-telluride photodiode arrays which is simple and yet provides excellent yields of high performance devices.

1 Claim, 7 Drawing Figures

LEAD-TIN-TELLURIDE PHOTODETECTOR ARRAY

The invention described herein may be manufactured, used, and licensed by or for the Government for governmental purposes without the payment of any royalty thereon.

BACKGROUND OF THE INVENTION

Photodiodes sensitive to infrared light, particularly in the spectral region of wavelengths measuring about ten micrometers, have become increasingly important in recent years for both military and industrial uses. In the military they are used extensively in surveillance systems and homing type guidance systems. In industry they are used to observe and control products in extremely hot environments such as furnaces and anneling ovens. These devices are easily fabricated, but the processes used heretofore have not provided satisfactory yields.

BRIEF DESCRIPTION OF INVENTION

An object of the invention, therefore, is to provide a process for fabricating arrays of the type discussed above wherein the parameters of certain steps are carefully controlled to produce greater yields.

BRIEF DESCRIPTION OF DRAWINGS

The invention is best understood with reference to the attached drawings wherein.

DESCRIPTION OF INVENTION

Figure 1:
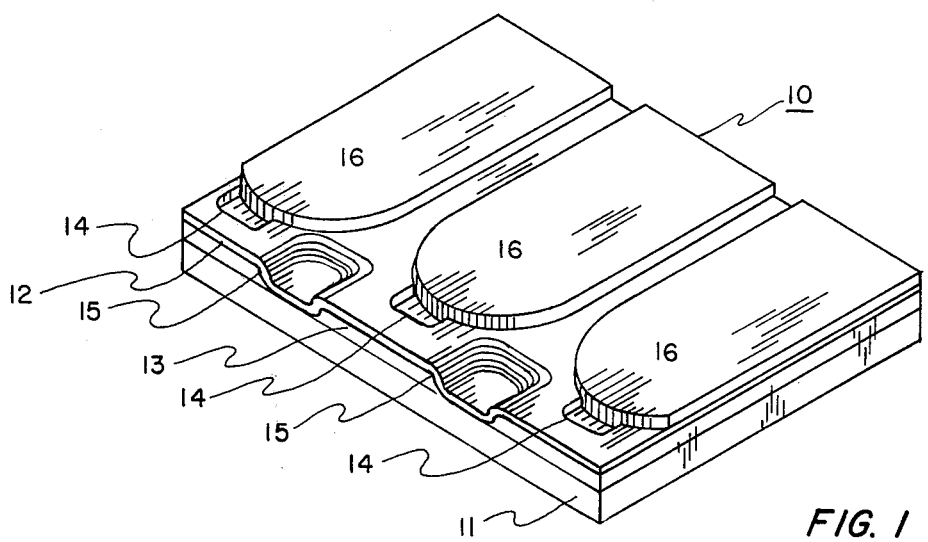
FIG. 1 shows a portion of an array of photodetectors in which the present invention is utilized.

Referring specifically to FIG. 1 there is shown a portion of a photodiode array 10 to which the present invention is applicable. The array is formed on the surface of a chip 11 of of $Pb_{.8}Sn_{.2}Te$. A thin layer of insulating material 13, which may be a positive photoresist, covers this surface and has rectangular, or any other shape, holes that present a small compact area (e.g. 50 × 100 micrometers) like holes 14 and 15 which are etched through the photoresist to expose the chin surface. A thin layer of indium 12 is applied over the photoresist. This layer is subsequently diffused into the chip 11 through the holes to form diodes. A series of indium lead out structures 16, in this case the bonding pads 16, lie on the thin indium layer, the photoresist insulating both from the chip surface except in the area of the holes. The resistance of the thin layer of indium measured parallel to the chip surface is high enough to maintain isolation of the signals on pads 16.

A signal voltage between the indium lead-out and the chip occurs when photons strike the indium treated surface. The photodiode areas in this instance form a line aray with every other photodiode staggered. The lead out structures for holes like 15, if shown, would lie mainly on the opposite side of the array to permit the use of large structures as shown. For a two dimensional array the leads would obviously have to be smaller within the array but could be expanded once outside. An area approximately an order of magnitude greater than the rectangular holes are required for the bonding pads 16.

Figure 2:
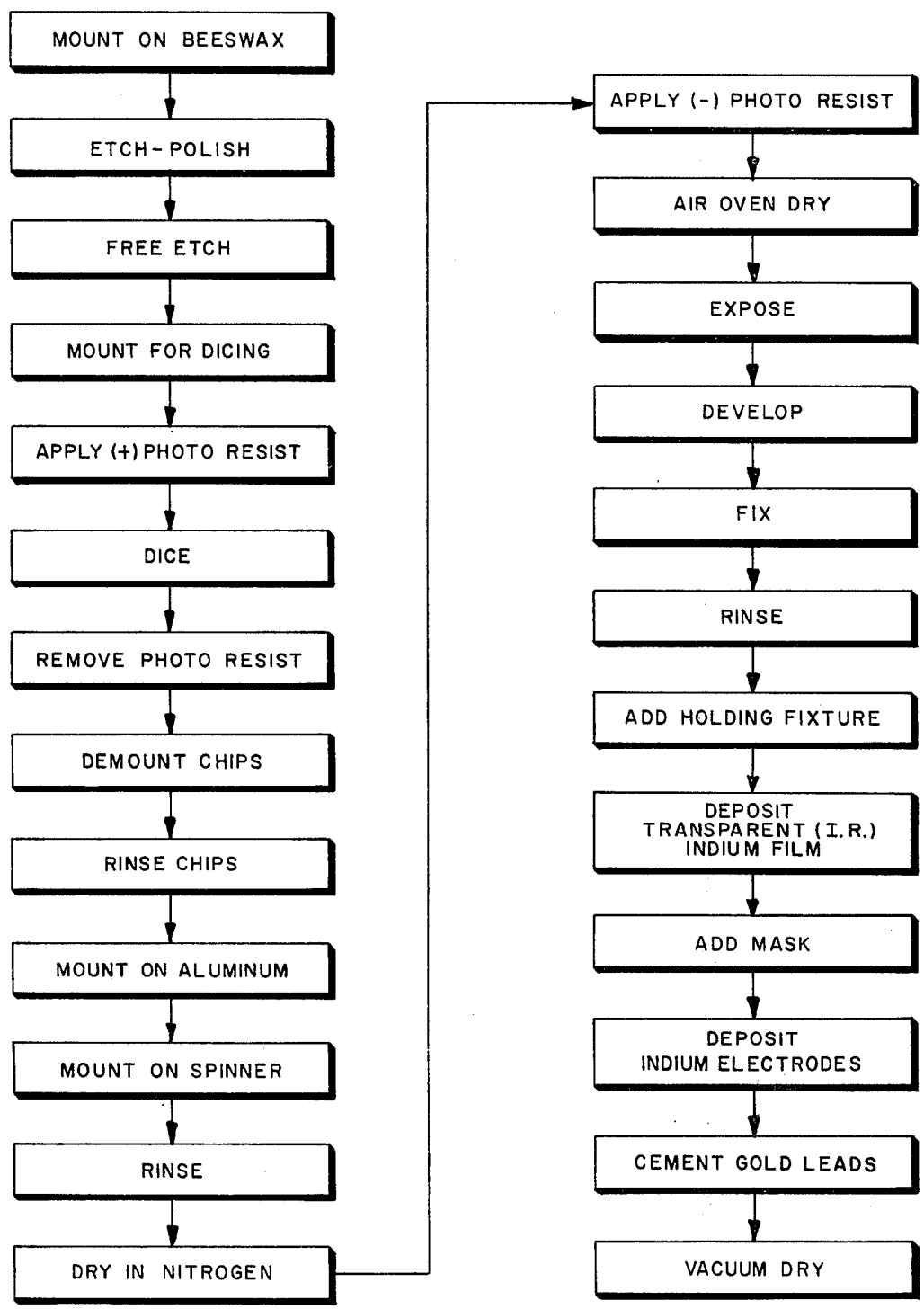
FIG. 2 shows a flow diagram of processes involved in the present invention.

The optical properties of the diodes are strongly dependent on the manner in which they are formed. FIG. 2 shows a flow diagram of the steps followed in forming the diodes used in the present invention. A smaple of annealed $Pb_{.8}Sn_{.2}Te$ prepared as described in the article "Preparation of Vapor Grown Lead-Tin Telluride for 8–14 Micrometer Photodiodes" by A. Bradford and E. Wentworth, *Infrared Physics,* 1975, Volume 15, pp. 303–309, Pergamon Press, Printed in Great Britain; is obtained an processed in the following manner:

1. After inspecting the annealed wafer for any damage due to either thermal etching or handling, it is mounted on a glass lapping block with beeswax which has been heated only slightly above its softening point;

2. The above is followed by etch-polishing the wafer on a pellon pad with an 18 percent solution of bromine in hydrobromic acid for approximately 10 minutes to remove 200 micrometers (8 mils) of $Pb_{.8}Sn_{.2}Te$;

3. The inevitable polishing damage introduced by this step is removed by free etching the polished wafer in an 8 percent solution of bromine in hydrobromic acid for approximately 5 minutes to remove an additional 150 micrometers (6mils). The wafer at this point is roughly 0.9mm (36 mils) thick;

4. Next the wafer is mounted on a carbon block for dicing leaving the polished, damage ree side exposed and using glycol phthalate which has been heated only slightly above its softening point as an adhesive;

5. The exposed top side of the wafer is then coated with a protective layer of photoresist such as TYPE AZ-1350-U Positive Working Photoresist, made by the Shipley Company, Inc., Newton, Massachusetts, and air dried at 60° C for 15 minutes;

6. The wafer is then diced to detector array size chips approximately 7mm × 3mm with a wire saw using a 10 mil diameter nichrome blade and a slurry of 600 mesh silicon carbide in a 12 percent glycerin and water solution;

7. After dicing, the Shipley photoresist is removed with an acetone stream;

8. After dicing $Pb_{.8}Sn_{.2}Te$ chips are removed from the carbon cutting block by heating above the softening point of the glycol phthalate;

9. The chips are then placed on a teflon chip tray and rinsed sequentially in acetone, trichloreghylene, acetone, deionized water and methanol;

10. All subsequent handling and photodiode electro-optical testing are facilitated by mounting the detector chip or wafer on a one-half inch diameter aluminum substrate disc 1mm thick using an electrically insulating epoxy such as Stycast 2057 Casting Resin made by Emerson and Cumming, Inc., Canton, Massachusetts, having approximately the same thermal expansion coefficient as the aluminum and $Pb_{.8}Sn_{.2}Te$. The epoxy is cured by heating the Pb$_{.8}$Sn$_{.2}$Te/epoxy/aluminum substrate on a hot plate to 125° C for 1 hour in normal ambient atmosphere;

11. The chip and aluminum substrate assembly is first placed in the center of a rotating table or spinner having an axis of rotation normal to the chip and an angular velocity of 4000 rpm;

12. While spinning the assembly is washed for 30 seconds with a stream of methanol from a wash bottle;

13. Dry nitrogen gas is then used to dry the chip;

14. While still spinning, a coating of Waycoat Negative HR Resist 100, made by Hunt Chemical Company, Palisades, New Jersey is formed by applying a drop of this material on the center of the chip and allowing it to spin for 30 seconds;

15. The assembly is then placed in an oven and air dried at 65° C for 30 minutes.

16. The array pattern is then projected on the chip with a strong ultravoilet light source long enough to insure complete exposure (usually not more than 5 seconds);

17. The assembly is placed in a beaker of Waycoat negative resist developer and developed for 45 seconds while the beaker is gently agitated by hand;

18. The assembly is then placed in a beaker containing Waycoat I.C. thinner which is similarly agitated for 10 seconds;

19. To clean the assembly it is rinsed in a wash bottle stream of electronic grade isopropanol for twenty seconds, blown dry with nitrogen gas, and oven air dried at 65° C for 30 minutes. At this point the assembly is ready for the indium evaporation and subsequent diffusion which form the optically active photodiode junction. The Waycoat negative photoresist is used to both delineate active detector areas and simultaneously serve as an insulating layer for the bonding pads of the lead-out structure.

20. The assembly is next placed in a holding plate for the evaporation and diffusion of the thin (approximately 100 A) "layer" of indium which forms the diode junction. No delineating evaporating mask is thought to be necessary at this point since it has been found that for indium "thicknesses" less than 2000 A evaporated onto insulating substrates held close to room temperature, resistances greater than 10$^7$ ohms/square are typical.

21. The holding plate is next mounted in a diffusion pumped high vacuum system and the thin indium layer deposited on the chip and photoresist layer. The structure of the vacuum system is shown in some detail in FIG. 3. The typical time schedule in the high vacuum system is as follows:

| PROCEDURE | TIME |
| --- | --- |
| pump to 5 × 10$^{-5}$ | 20 – 40 minutes |
| heat Pb$_{.8}$Sn$_{.2}$Te to 150° C | 2 – 4 minutes |
| maintain at 50° C | 1 hour |
| cool to 40° C | |
| deposit indium | 2 – 10 seconds |
| heat to 100° C | 2 hours |
| heat to 200° C | 2 – 4 minutes |
| maintain at 200° C | 1.5 hours |
| cool to 130° C | |
| maintain at 130° C | 0.5 hours |
| cool to room temperature in closed vacuum system: | |

22. The holding plate is next removed from the vacuum and fitted with a mask which delineates the lead-out pattern, elements 16 of FIG. 1, (This step is preferably held to under 20 minutes);

23. The holding plate is then returned to the vacuum system which is pumped out for 2 hours to achieve a vaccum of 8 × 10$^{-6}$ Torr; and the indium lead-out structures are then deposited at the rate of 250 A per second until a total thickness between 0.5 and 1.0 micrometers is obtained;

24. At this point the array is again removed from the vacuum chamber and one mil diameter gold wires are attached to the lead-outs 16 and chip 11 (FIG. 1) with a conductive silver paste epoxy such as Acme E Solder No. 3021, made by Acme Chemicals and Insulation Company, Division of Allied Products Corporation, New Haven, Connecticut, at the same time the array can be mounted with screws on a cold finger from a cooling unit (e.g. a dewar) attaching the free ends of the same gold wires to appropriate test electrodes thereon with indium solder.

25. Finally the cold finger and/or array is placed in a vacuum system and a pressure of 10$^{-5}$ Torr is maintained until the epoxy dries (approximately 3 hours). If provisions are made in the vacuum sytem to immerse the cold finger in liquid nitrogen and to connect external test equipment to the test electrodes, the array can also be tested at this time.

Figure 3:
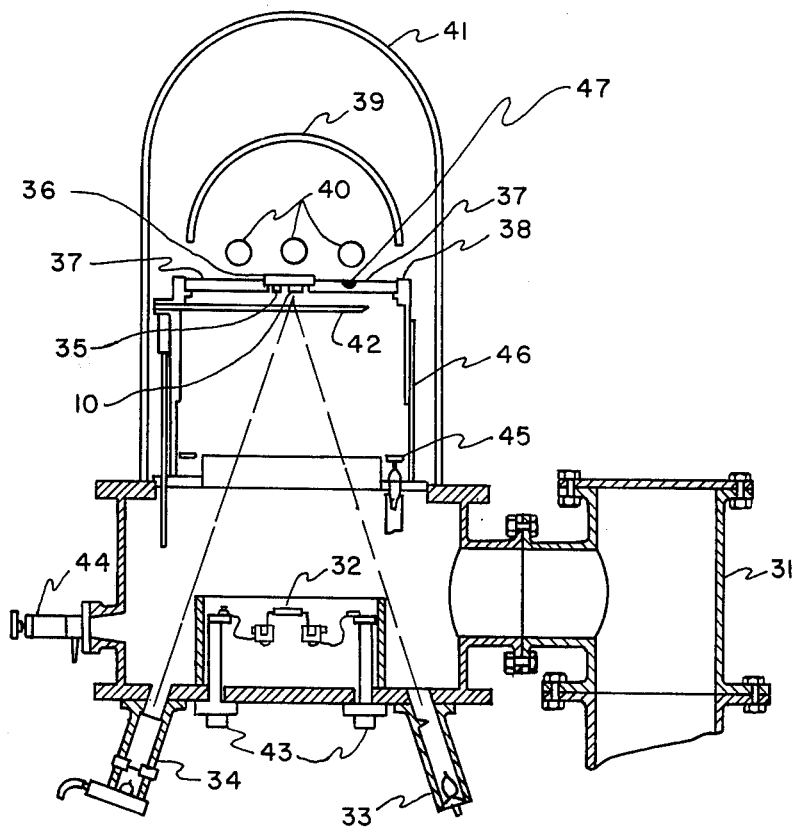
FIG. 3 shows the vacuum furnace used in the process of FIG. 2.

FIG. 3 shows the general arrangement of the diffusion pumped high vacuum system. Polyphenyl ether is used as the pumping fluid and the diffusion pump is connected to the main chamber through a side elbow 31. A resistance heated tungsten boat 32 with wall 0.015 inches thick is used as the evaporating source. Indium of 6-9s purity is used to charge the boat to about the half full level. Solid ingots as supplied by Cominco American Inc., Spokane Washington are preferred over indium shot. The distance between the boat and the Pb$_{.8}$Sn$_{.2}$Te to be coated is 20 inches. Deposition can be controlled by observing the light from a source 33 which is reflected by a glass monitor plate to photo cell 34, but the method preferred herein is to mount a quartz crystal monitor 35, which was calibrated by means of a Sloan Angstrometer, adjacent to the array 10. The thin indium film (100 A to 500 A thick) is deposited at a rate of about 50 A per second and a pessure of 3 × 10$^{-6}$ Torr. The crystal monitor which is vibrating in a shear mode exhibits a measureable frequency shift as this same film builds up on the crystal surface.

The array 10 onto which the indium is to be deposited is mounted on an aluminum substrate 36 and set into an open well in an aluminum plate 37 (2×inches × 2inches 33 1/16inch). This plate is set into a ceramic holder 38 to isolate it thermally from the more massive fixturing in the vaucum system. A radiant heater, which is set over the ceramic holder to form an oven, is made in the form of a half cylinder of 0.005 inch tantalum sheet 39 containing three 6 inch long quartz-halogen lamp 40 connected in paralle. Power required for the various parts of the heating cycles varies from 5 watts to 300 watts. Temperature is measured by means of an iron-constantan thermocouple 47 pressed into a blind hole in the aluminum plate. since this is a rather crude way of measuring temperature, the transient temperature of the lead-tin telluride chip may not always be the same as that of the thermocouple. However, it is felt that the steady state temperatures of the two are nearly the same during the extended heating periods (1 to 2 hours). The upper portion of the vacuum system is sealed by a glass bell jar 41. A leaf type shutter 42 is provided which has an exterior control to precisely initiate and terminate an evaporation. Sealed electrical terminals, such as power/terminals 43 are provided through the floor of the chamber to accomodate the electrical equipment inside. Furnace elements like needle valve 44 to admit gaseous materials and the glow discharge ring 45 used for ion scrubbing are not used herein. The cylindrical metal shield 46 and plate 37 control the spread of the evaporation products.

Figure 4:
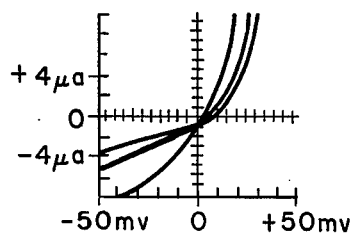
FIG. 4 shows a plot of current as a function of voltage applied normally over the opposed broad surfaces of several elemental detectors from FIG. 1.

The current-voltage relationship of the different photodiodes as measured on a Tektronix type 575 curve tracter is shown in FIG. 4. More accurate values of diode zero bias resistance and short circuit current are obtained by using a digital voltmeter and ammeter combination to measure diode current at diode voltages of $-1.0$, $0.0$ and $+1.0$ mv. Zero bias resistance-junction area products (RAj) are then calculated assuming a linear current voltage relation between the measured points. For comparison purposes such values are presented with the data to be described at FIG. 7.

Figure 5:
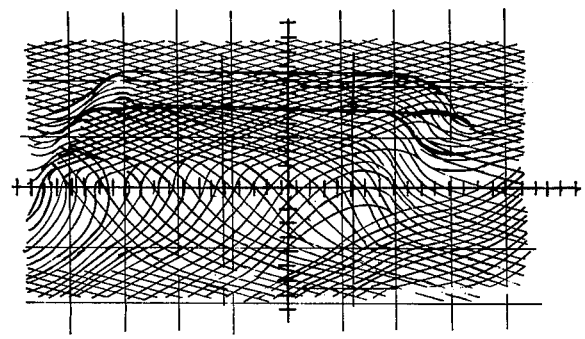
FIG. 5 shows a contour plot of the active area of one of the diode elements from FIG. 1 obtained by scanning the area with a narrow laser beam of incident radiation having a wavelength of 6328 angstroms (A)

FIG. 5 shows a typical laser scan result on one of the photodiodes. The optically active area of each of the different photodiodes as measured on a laser raster scanner using a visible 6328 A laser beam. To verify the fact that the active area determined with visible light remains essentially unchanged for infrared radiation, occasional checks are made with a blackbody contour plotter. To date, excellent correlation between these two different methods has always been obtained on bulk planar $Pb_.8Sn_.2Te$ photodiodes.

Figure 6:
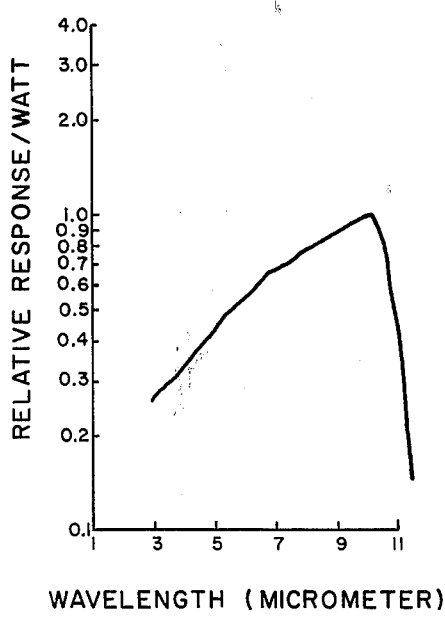
FIG. 6 shows a normalized graph of the response of an elemental detector from FIG. 1 as a function of the wavelength of incident radiation.

The relative spectral response that has been consistently obtained on various test diodes is shown in FIg. 6. This was obtained using a Perkin-Elmer Model 12-C Spectrophotometer modified to allow the monochromatic beam to exit the monochrometer housing and irradiate the infrared detector. The broad band response and peak between 9 and 11 microns is clearly demonstrated.

Figure 7:
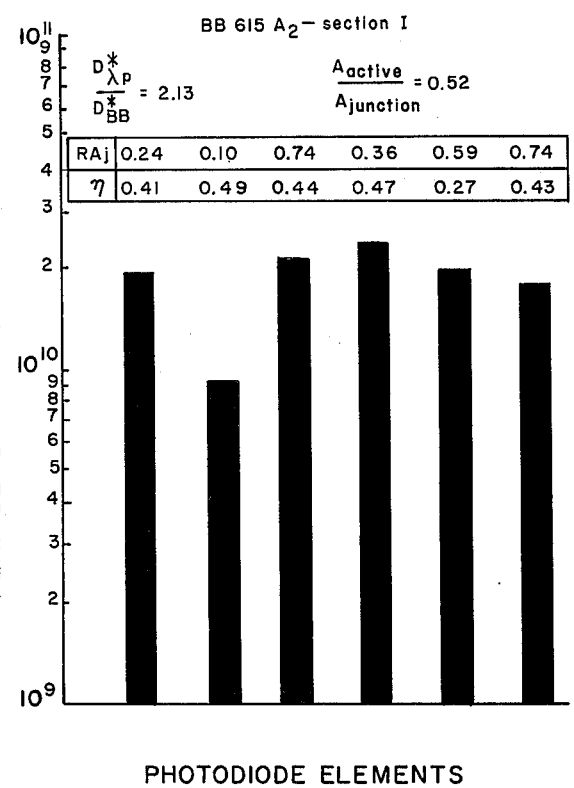
FIG. 7 shows a bar graph of the sensitivities (peak detectivities) of a typical group of elemental detectors in an array as shown in FIG. 1.

FIG. 7 indicates the sensitivity, as measured by $D^*\lambda_p$ zero bias resistance — junction area product, (Raj) and quantum efficiency 7 as determined by signal responsivity for a typical small test array. Device sensitivity $D^*\lambda_p$ has been determined in the conventional manner by measuring device signal-to-noise ratio when held in the radiation field of a chopped 500 Kelvin blackbody and coupling this with information on the measured active area and relative spectral response.

During the course of experimenting with the fabrication of the photodiodes several observations have been made which are worth noting here. Of primary importance, and obvious to anyone who has worked with bulk $Pb_.8Sn_.2Te$, is the care needed in handling the $Pb_.8Sn_.2Te$ material. For example, the material should not be subjected to any mechanical shock and the wafers must not be handled directly with tweezers. Frequent microscopic material inspections provide a good check for handling induced slip damage. The interference phase contrast microscope is ideal for this check. It has been found that spatulas are best for handling the $Pb_.8Sn_.2Te$. Another procedure which has been found essential is the removal by etching of a substantial amount (14 mils) of the $Pb_.8Sn_.2Te$ surface after annealing in order to expose undamaged, low carrier concentration p-type material for subsequent diffusion and diode formation. It has been found that before etching, the surface of an annealed wafer is generally n-type and always shows thermal damage or polygonization when examined with x-ray topography. Finally, it has been found that best results are obtained if as little time as possible elapses between the developing and rinsing of the Waycoat photoresist and the subsequent deposition and diffusion of the thin (100 A) indium film.

Obviously may modifications of the above methods and devices will immediately occur to those skilled in the art, but the invention is limited only as defined in the claims which follow.

We claim:
1. A photodiode array comprising:
a wafer of $Pb_.8Sn_.2Te$;
an insulating layer covering most of the exposed surface of said chip defining only a plurality of small rectantular windows wherein the surface of the chip is exposed;
a thin layer of indium covering all of said insulating layer and all of said rectangular windows; and
a plurality of thick indium lead-out pads mounted on said thin layer, each pad overlapping only a different one of said rectangular windows.

* * * * *